(12) United States Patent
Joodaki (10) Patent No.: US 7,053,747 B2
(45) Date of Patent: May 30, 2006

(54) METHOD FOR PRODUCING A SPIRAL INDUCTANCE ON A SUBSTRATE, AND A DEVICE FABRICATED ACCORDING TO SUCH A METHOD

(75) Inventor: Mojtaba Joodaki, Munich (DE)

(73) Assignee: Atmel Germany GmbH, Heilbronn (DE)

( * ) Notice: Subject to any disclaimer, the term of this patent is extended or adjusted under 35 U.S.C. 154(b) by 0 days.

(21) Appl. No.: 11/122,057

(22) Filed: May 5, 2005

(65) Prior Publication Data

US 2005/0248431 A1    Nov. 10, 2005

(30) Foreign Application Priority Data

May 5, 2004    (DE) ................. 10 2004 022 139

(51) Int. Cl.
*H01F 5/00*    (2006.01)
(52) U.S. Cl. .................. 336/200; 257/531; 438/381
(58) Field of Classification Search ............ 336/83, 336/200, 232; 257/531, 622; 438/381, 700
See application file for complete search history.

(56) References Cited

U.S. PATENT DOCUMENTS

| | | | |
|---|---|---|---|
| 4,379,307 A | 4/1983 | Soclof | |
| 5,539,241 A | 7/1996 | Abidi et al. | |
| 5,773,870 A | 6/1998 | Su et al. | |
| 5,930,637 A * | 7/1999 | Chuang et al. | 438/381 |
| 6,211,056 B1 | 4/2001 | Begley et al. | |
| 6,287,931 B1 * | 9/2001 | Chen | 438/381 |
| 6,495,903 B1 * | 12/2002 | Xu et al. | 257/531 |
| 6,693,039 B1 * | 2/2004 | Erratico et al. | 438/700 |
| 6,720,229 B1 * | 4/2004 | Norstrom et al. | 438/381 |
| 2003/0155617 A1 | 8/2003 | Woo et al. | |

* cited by examiner

*Primary Examiner*—Tuyen T Nguyen
(74) *Attorney, Agent, or Firm*—McGrath & Geissler, PLLC (57) ABSTRACT

A device and a method for producing such a device is provided, whereby the windings of a spiral inductance are embedded in a membrane such that they are freely suspended over a completely back-etched area of the substrate for a decoupling of the windings from the substrate. An additional substrate is connected to the bottom side of the back-etched area of the processed substrate such that a hollow cavity is formed for a decoupling of the windings from the substrate.

34 Claims, 8 Drawing Sheets

*(Conventional Art)*

FIG.1

*(Conventional Art)*

FIG.2

(Conventional Art)

FIG.3

(Conventional Art)

FIG.4

*(Conventional Art)*

FIG. 5

*(Conventional Art)*

METHOD FOR PRODUCING A SPIRAL INDUCTANCE ON A SUBSTRATE, AND A DEVICE FABRICATED ACCORDING TO SUCH A METHOD

This nonprovisional application claims priority under 35 U.S.C. § 119(a) on German Patent Application No. DE 102004022139.1, which was filed in Germany on May 5, 2004, and which is herein incorporated by reference.

BACKGROUND OF THE INVENTION

1. Field of the Invention

The present invention relates to a method for producing a spiral inductance on a substrate and a device that is fabricated in accordance with such the method.

2. Description of the Background Art

With increasing operating frequency, device modeling for devices that are integrated on a semiconductor substrate is playing an increasingly bigger role because it causes transmission-line properties, reflections on discontinuities, overlapping and dissipations to increase. Thus, taking these effects into consideration in modeling, particularly in the high frequency field, is generally a must. In particular, in a low-resistance substrate, for example a silicon substrate of a silicon-germanium substrate, the parasitic influence of the substrate conductance and additional capacitances is not to be neglected.

Although generally applicable to any inductance, the present invention and the problems it is based on is described in detail in regard to a spiral inductance.

Inductances integrated on a substrate are valuable devices in radio frequency circuitries, which have a wide application range, for example, in cordless communication systems. Categorized as cordless communication systems are, for example, personal communication services, wireless local area networks, satellite communication systems, global positioning (GPS) systems, etc.

General problems with integrated inductances are the relative low quality factors, obtaining a satisfactory grounding, deviating characteristics depending on the substrate geometry, electromagnetic couplings between inductances and the substrate, and relatively low self-resonance frequencies. The inductances are often used as small band loads in radio frequency circuits, for example, amplifiers, oscillators, or the like. Thus, there is a wide field of application to be found for inductances, particularly in the consumer electronics market. However, production costs, integration density, and reliability are additional deciding factors, which have to be considered in the production of integrated inductances.

Since the technology in the radio frequency field is shifting from big systems with a wide transmission range to smaller systems with a more limited range, and newer systems are increasingly becoming mobile systems, the trend in the RF field is to build radio-frequency-suitable devices that are more economical and easier to use.

To realize integrated inductances, spiral inductances have become accepted in planar circuit technology. The attainable inductance values hereby range from 0.1 nH to 10 nH. The spiral inductances can thereby have round as well as rectangular windings with diverse geometries. Spiral inductances play an important role in, for example, integrated circuits in the radio frequency field, whereby they are frequently used as devices for minimizing phase noises, as inductances with low dissipation for LNA connections, or as inductances with low electrical resistance for amplifier outputs, as loads, or as emitters/source degenerators with negligible voltage drop for operations in the low voltage area in silicon-based integrated circuit processes.

The problem in general is, therefore, that an integration of planar spiral inductances on, for example, a silicon substrate, usually results in performance losses in regard to the resonance frequency and the quality factor. Primarily, the coupling between the spiral inductance and its surrounding area over the silicon substrate, and the lack of a good earth plane due to substrate losses is the cause of such disadvantages of the integrated spiral inductances. In addition, the magnetic flow along the coil, which is directed vertically into the substrate, also causes substrate losses due to the generated eddy currents. These effects also reduce the quality factor of the integrated planar spiral inductance.

Several conventional attempts have been made to integrate spiral inductances in a silicon substrate with the objective to improve the quality factor and the natural frequency resonance of the inductances on the silicon substrate.

Figure 1:
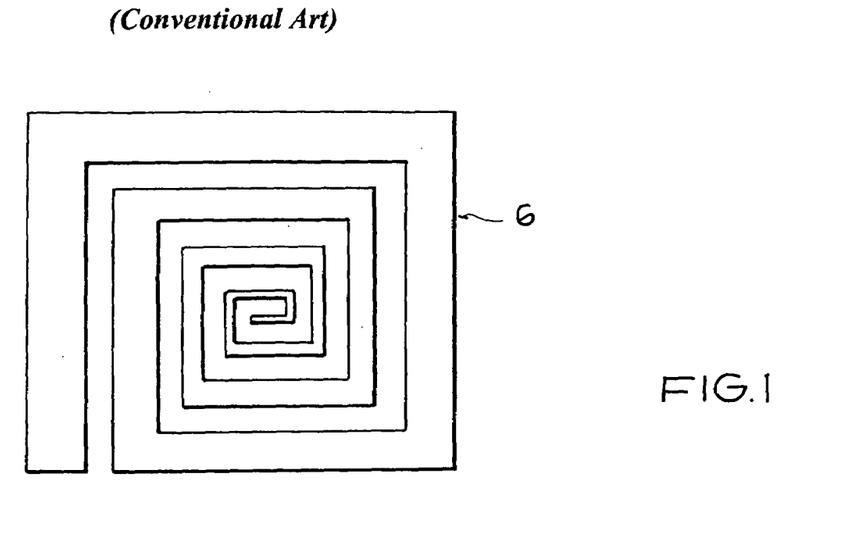
FIG. 1 is a schematic top view of a structure of a spiral inductance according to a conventional approach.

In a conventional approach, the winding width of the windings of the spiral inductance is steadily increased from the inside to the outside, as is illustrated in FIG. 1. The magnetic losses of the spiral inductance can thereby be considerably reduced. However, this is relatively difficult to do.

Figure 2:
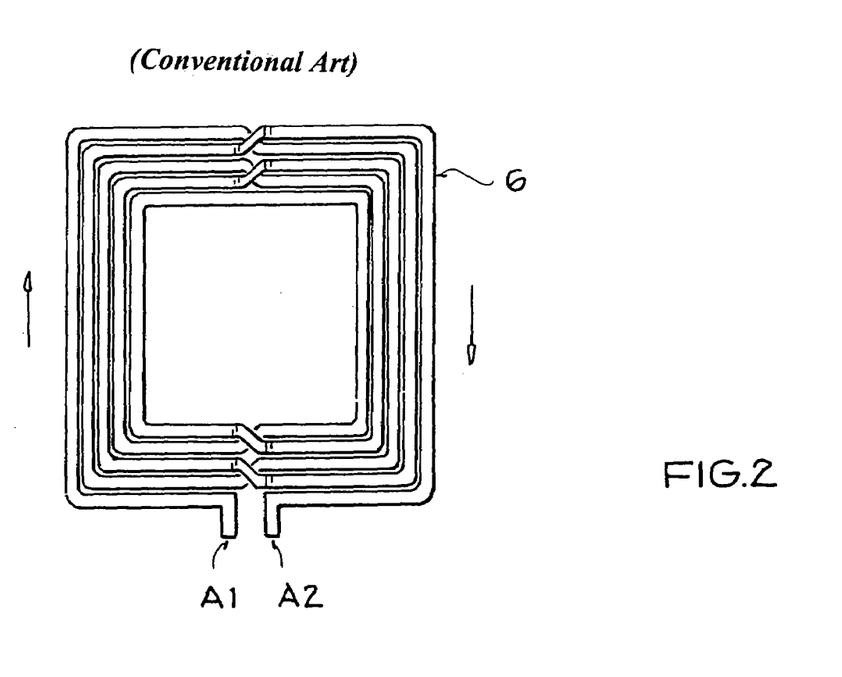
FIG. 2 is a schematic view of a structure of a spiral inductance according to a further conventional approach.

FIG. 2 illustrates a further conventional approach, whereby in contrast to an inductance having only one end, two winding units are positioned in correlation to one another to raise the quality factor and the self-resonance frequency. The voltages and currents on the terminals A1 and A2 preferably have a phase offset of 180 degrees. However, this approach has the disadvantage that high coupling, that is, substrate losses occur.

Figure 3:
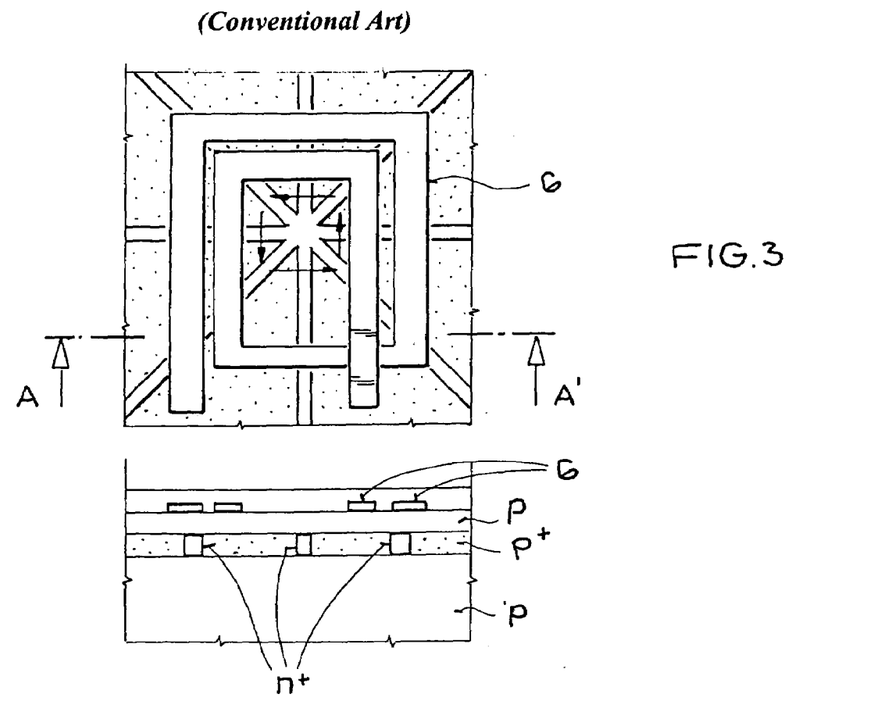
FIG. 3 is a schematic top view and a cross-sectional view along the line A–A' of an integrated inductance according to a further conventional approach.

FIG. 3 illustrates a further conventional approach for producing an integrated inductance, whereby a p-n-p transition vertical to the eddy current flow is utilized to reduce the substrate losses of the integrated inductance 6. The eddy currents are indicated in FIGS. 3 and 4 by closed, interconnected arrows.

Figure 4:
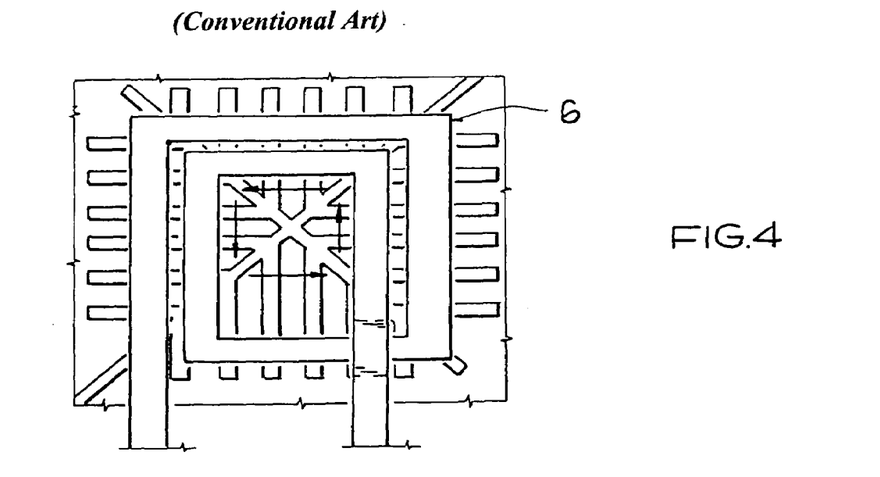
FIG. 4 is a schematic top view of an inductance according to a further conventional approach.

FIG. 4 illustrates a further conventional approach, whereby a structured ground shielding between two adjacent inductances is used to raise the quality factor and to minimize the substrate coupling. The ground metallization is lamellar, with slots arranged in between, which are etched into the ground metallization 5 in a direction that is vertical to the spiral inductance. The width of the slots should be narrow enough to prevent the electrical field from penetrating the silicon substrate below. This, however, requires a relatively elaborate procedure.

Figure 5:
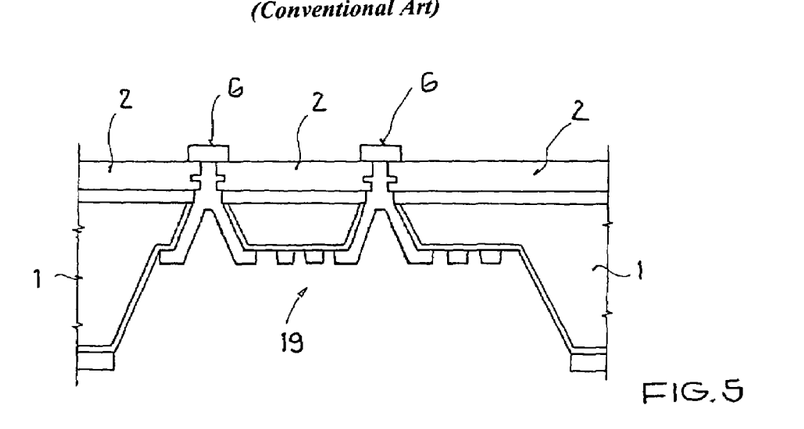
FIG. 5 is a cross-sectional view of an inductance structure according to a further conventional approach.

FIG. 5 illustrates an inductance structure according to a further conventional approach. The wafer is hereby thinned from the bottom side of the silicon substrate in order to integrate the spiral coil space-economically on the wafer. The disadvantage thereby is that substantial substrate losses occur.

Figure 6:
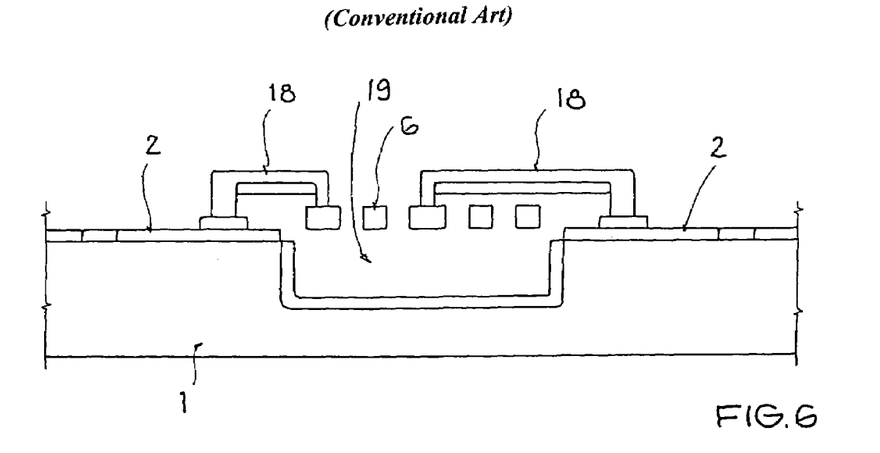
FIG. 6 is a cross-sectional view of an inductance structure according to yet another conventional approach.

Lastly, FIG. 6 illustrates a further conventional approach to an integrated inductance. A back-etched area 19 in the substrate 1 below the windings 6 is thereby etched, whereby the windings 6 are supported over the back-etched area 19 by bridging metallizations 18. The back-etched area 19 reduces the electromagnetic coupling between the inductance 6 and the substrate 1 and reduces the parasitic capacitance between the inductance 6 and the silicon substrate 1, which results in a raised quality factor and self-resonance frequency. This back-etched area 19 is formed deep enough so that potentially induced eddy currents are reduced. Thus, the entire dissipation is substantially reduced.

The disadvantage of this conventional approach has proven to be the fact that the production process is very complicated, expensive, and time-consuming. Furthermore, a parasitic capacitance between the metallizations 6 and substrate 1 remains due to the bridging metallizations 18. In addition, the fabrication of this bridging construction requires method steps for forming the bridging construction, which include a reactive ionic etching (DRIE) and the deposition of an approximately 30 µm-thick silicon dioxide layer.

SUMMARY OF THE INVENTION

It is therefore the object of the present invention to provide a method for producing a micro-shielded spiral inductance and a device having a spiral inductance that is fabricated in accordance with such a method, which eliminates the aforementioned disadvantages and in particular ensures a simpler and more cost-effective method as well as a device having lower electrical losses and simpler grounding.

The present invention is based on the idea that an improved integration of the individual metallizations and windings of the spiral inductance, and a direct connection of the upper and lower ground metallizations as well as an increased thickness of the windings of the spiral inductance, the thickness being fabricated in a simple manner, is ensured by the following steps: Forming a structured inductance metallization and a structured upper ground metallization on the top side of a substrate; forming a second dielectric insulating layer at least between the inductance metallization and the upper ground metallization and over the inductance metallization; complete back-etching of a substrate area below the inductance metallization such that at least the windings of the inductance metallization are freely suspended over the completely back-etched area of the substrate, being completely supported by embedding in the insulation layer; and structured metallization of the surface of the back-etched area of the substrate to form an end-to-end connected ground point and of the segments of the inductance metallization located over the completely back-etched area to form windings of the spiral inductance with increased thickness.

In this way, a spiral inductance can be constructed using a simple and cost-effective production method, whereby the windings are totally shielded from external influences without additional covering and are entirely decoupled from the substrate such that no electromagnetic coupling with the substrate and, therefore, with other devices can occur. Interferences, electromagnetic losses, substrate losses etc. can thereby be reduced or completely eliminated.

Furthermore, the upper metallizations are directly connected to the lower ground metallization so that beneficially only one uniform ground connection is required.

In addition, the windings of the spiral inductance are, in a simple way, made thicker than in a device that was fabricated according to a conventional method. This beneficially reduces the electromagnetic losses and the electrical resistance of the spiral inductance.

Additionally, the present device is suitable for monolithic integration of the spiral inductance for use in the radio frequency field, that is, the high frequency field for silicon-based technologies. All in all, the performance of the device is thus improved, which, in addition, can be fabricated in a more cost-effective way with a simpler production method, as previously described.

In an example embodiment, an additional layer, particularly a first dielectric insulating layer, can be formed on the top side of the substrate prior to forming the metallizations.

In a further example embodiment, lower ground metallizations are formed from the bottom side of the substrate by the structured metallization of the surface of the back-etched area of the substrate and the segments of the individual metallizations that are located over the completely back-etched area, whereby the each of the lower ground metallizations is connected with those segments of the corresponding upper ground metallizations that are located over the completely back-etched are of the substrate. Thus, a direct connection of the upper and lower ground conductors is achieved without a disadvantageous intermediate layer. In this way, an overall uniform ground connection can be made, which can be done in an economical way. Additionally, the thickness of the windings of the spiral inductance is increased due to the lower metallization so that the electrical resistance is beneficially reduced.

It is beneficial to execute the complete back-etching of an area of the substrate below the windings of the spiral inductance in two consecutive etching steps. Preferably, the first etching step thereby includes the partial back-etching of an area of the substrate below the windings of the spiral inductance such that a thin substrate layer remains below the windings. In a subsequent second etching step, a segment of the previously formed thin substrate layer is completely back-etched by using, for example, a wet chemical etching procedure, to form a staggered structure of the back-etched area of the substrate below the windings. This results in a higher integration density, whereby the segments of the previously formed thin substrate layer that were not completely back-etched ensure a greater stability of the substrate surface. In particular, both the first and the second etching step can be carried out as a wet chemical etching procedure.

In the second etching step, for example, a further (fourth) insulating layer on the bottom side of the substrate and the surface of the partially back-etched segment is deposited, whereby the fourth insulating layer is suitably structured by developing, for example, of a vapor-deposited photoresist material to ensure the desired anisotropic complete back-etching of a segment of the previously formed thin substrate layer. As final treatments, the photoresist layer, for example, can be rinsed off with a suitable solvent like acetone, for example, and the insulating layers remaining on the bottom side of the substrate can be removed using, for example, a wet chemical etching procedure or a dry etching procedure.

In yet another embodiment, a further substrate of suitable geometry can be attached to the bottom side of the processed substrate for forming an air gap. Due to the favorable dielectric constants of air, this creates a good shielding of the spiral inductance from the substrate and other neighboring devices. In this way, substrate losses and electromagnetic losses can be reduced. The additional substrate preferably has a metallization on the surface, which can be connected to the lower ground metallization, at least partially. Thus, the resistance of the lower ground conductors can be reduced and in addition, a mechanically stable connection can be attained.

Preferably, the geometry of the further substrate is such that at least in part, it can be formclosed inserted in the partially back-etched area. Thus, once again a well-shielded cavity and an excellent decoupling of the windings of the spiral inductance from the substrate and from adjacent devices is created. Furthermore, the surface of the further substrate can also have a metallization, which can be connected to the lower ground metallization of the processed substrate. In this way, the electrical resistance of the ground conductors can be substantially reduced and the stability of the entire device can be increased.

In a further embodiment, a photoresist layer, that is, a photolack, is formed on the surface of the back-etched area of the substrate and radiated, that is, developed accordingly, prior to the structured metallization. The photolack is a simple variant of a mask for a structured metallization of the substrate.

The second insulating layer can be provided with bridgeover openings during fabrication, between which a bridging metallization for a bridgeover of at least one terminal of the spiral inductance is formed.

In yet a further embodiment, a covering metallization can be formed over the spiral inductance, that is, the inductance metallization, which is applied in the shape of a lid on the upper ground metallization. Thus, a completely shielded system and a uniform ground line for the entire system is produced. Additionally, the spiral inductance is shielded from exterior interferences and from dirt.

For example, a plurality of spiral inductances can be provided adjacent to one another on a shared substrate, whereby the substrate is subjected to collective method steps for forming the respective cavities and metallizations. Thus, each individual spiral inductance does not have to be fabricated separately but all spiral inductances can be cost-effectively fabricated at the same time by using collective method steps. For example, the respective ground metallizations of neighboring spiral inductances are electrically connected with one another via the lower ground conductor that was formed by structured metallization. Thus, once again one uniform ground point is sufficient. The spiral inductance can have, for example, rectangular or round windings, or the like.

In particular, the substrate is a silicon semiconductor substrate. The individual metallizations are preferably of aluminum, copper, silver, gold, titanium, or the like.

In a further embodiment, the dielectric insulating layers, with the exception of the membrane, are made of an inorganic insulating material, for example, a silicon oxide, particularly a silicon dioxide, silicon with buried air gaps, silicon nitride, or the like.

The dielectric insulating layer serving as a membrane is beneficially made of an organic insulation material, for example, an organic polymer material like benzocyclobutene (BCB), a SiLK resin, an SU-8 resist, polyimide, or the like.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Identical reference numerals in the figures designate identical components, or components with identical functions, unless indicated otherwise.

FIGS. 7a to 7m illustrate cross-sectional views of an exemplary device in selected method modes, whereby with reference to FIGS. 7a to 7m, a production method for a device having a spiral inductance on a substrate according to a first embodiment of the present invention is described in detail.

Figure 7A:
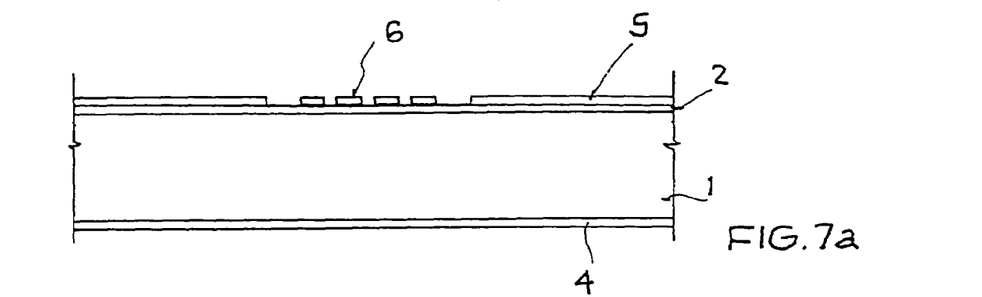
FIGS. 7a to 7m are cross-sectional views of a device of the present invention with an inductance integrated on a substrate in various method modes to illustrate the individual method steps according to a first embodiment of the present invention.

As is shown in FIG. 7a, for example, in a step for the fabrication of metallizations, the top and bottom sides of a substrate 1 are coated with a first layer, for example, a first dielectric insulating layer 2, that is, a further dielectric insulating layer 4 (henceforth referred to as third insulating layer 4). However, in certain instances, layers 2 and 4 can also be omitted. The substrate 1 is, for example, a low-resistance silicon semiconductor substrate, or the like. Both the first and the third dielectric insulating layer 2, or 4, can be formed, for example, as an approximately 1–2 μm-thick silicon nitride or silicon dioxide layer. Subsequently, an inductance metallization 6 and an upper ground metallization 5 is applied to the first dielectric insulating layer 2 using, for example, a conventional metallization method, to form the spiral inductance. Preferably, the inductance metallization 6 has rectangular windings and two terminals. Aluminum has proven to be a particularly suitable material for the metallizations 5 and 6. However, other materials can also be used, for example, copper, gold, silver titanium, or the like.

Figure 7B:
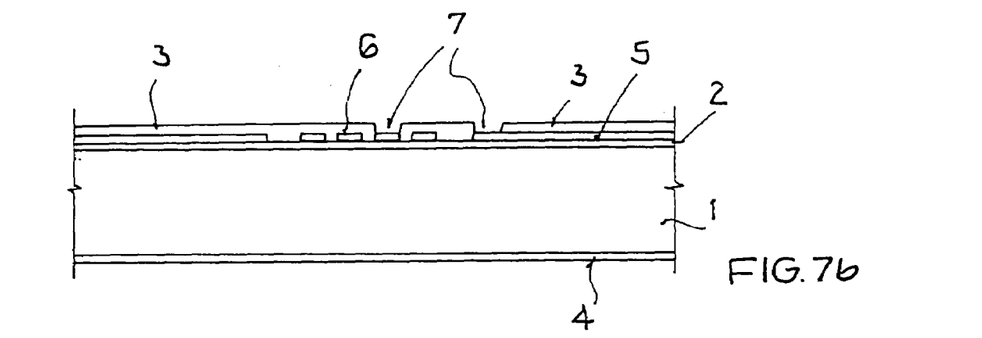

Next, as is illustrated in FIG. 7b, a second dielectric insulating layer 3 is formed over the first dielectric insulating layer 2 and at least over the inductance metallization 6 such that the inductance metallization 6 is completely embedded in the second dielectric insulating layer 3. To get a clearer picture, see the top view in FIG. 8.

The second dielectric insulating layer 3 serves as a carrier membrane and is preferably made of the material SU-8, which is, for example, centrifuged onto the top side of the substrate 1 and subsequently subjected to a temperature treatment for hardening. SU-8 is a negative photolack, that is, a negative photoresist with excellent characteristics for high frequency applications. It is noted here that after the SU-8 layer 3 has been applied to the surface of the substrate 1, it is very difficult to remove the hardened coat. For this reason, the SU-8 layer 3 should be suitably structured and back-etched in defined areas for potential additional metallizations, particularly bridgeover metallizations. A further advantage of the SU-8 material is that it is robust to anisotropic etching solutions, for example, a KOH solution. The second dielectric insulating layer 3 serving as a membrane, for example, can also be made of a different organic insulation material, for example, an organic polymer material, particularly benzocyclobutene (BCB), a SiLK material, a polyimide, or the like.

In a subsequent step, the substrate is etched back below the spiral inductance in a staggered arrangement by two consecutive substrate etching processes such that below the windings of the inductance metallization 6, a staggered back-etched area is formed. This is described in more detail below.

Figure 7C:
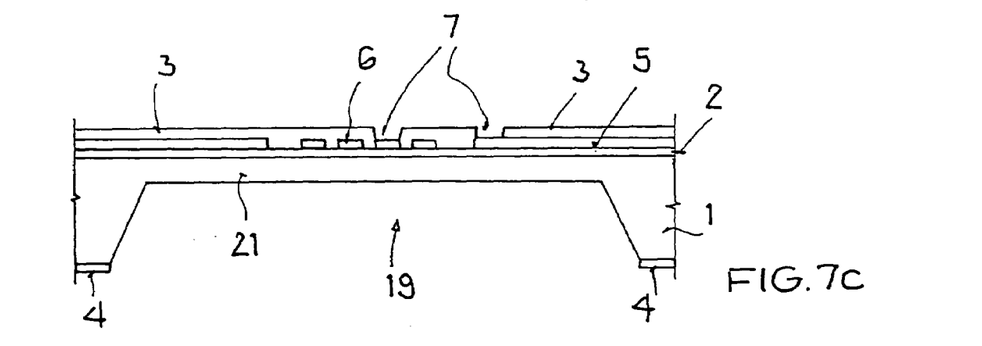

To start with, in a first substrate etching step, as is illustrated in FIG. 7c, a first area 19 of the substrate 1 is partially etched back such that a thin substrate layer 21 of about 20–30 μm remains below the spiral inductance. The third dielectric insulating layer 4, for example, is thereby used as a suitable mask for this etching procedure. As a result of the anisotropic partial back-etching of the substrate 1, a oblique boundary area of the partially back-etched area 19 is formed.

Figure 7D:
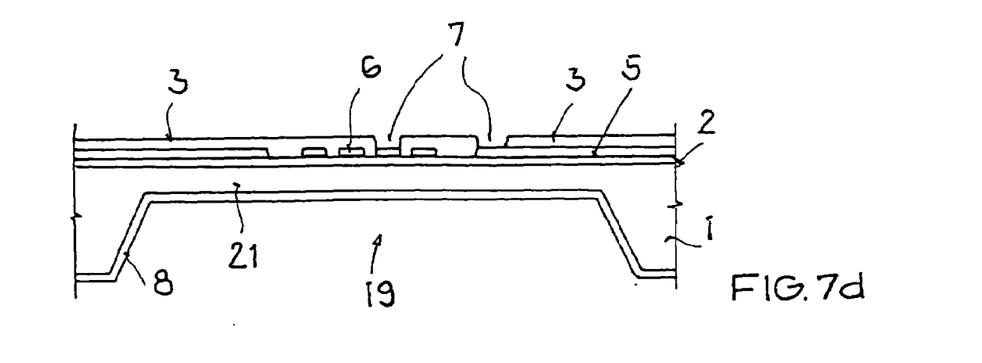

Next, a fourth dielectric insulating layer 8 that is also made of silicon dioxide or silicon nitride, for example, is deposited on the surface of the first back-etched area 19 by using a conventional deposition procedure. This is schematically illustrated in FIG. 7d.

Figure 7E:
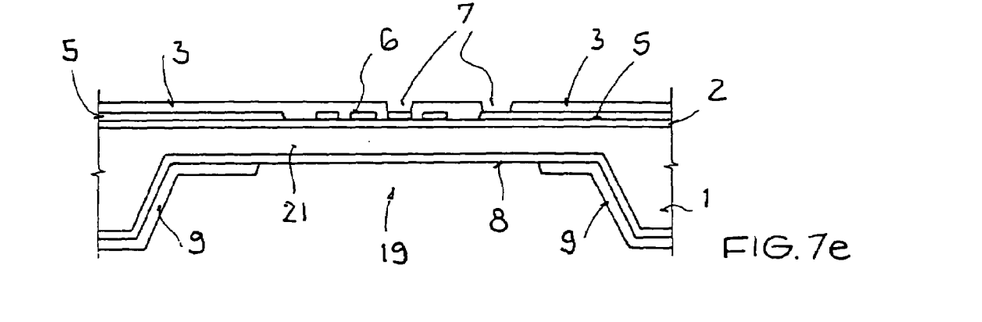

In a following method step according to FIG. 7e, a first photoresist layer 9, for example, a photolack 9, is applied as a mask and developed.

Figure 7F:
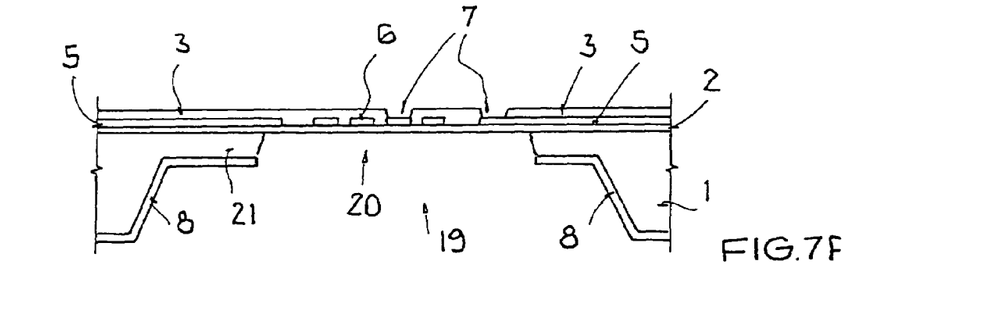

As is shown in FIG. 7f, the fourth dielectric insulating layer 8 (see FIG. 7d), that is, the thin substrate layer 21, which was previously applied to the surface of the first back-etched area 19, is, with the aid of the photo mask 9, completely back-etched below the windings of the inductance metallization 6, but only in an area 20, which approximately equals the width of the windings of the inductance metallization 6, thereby forming the structure as illustrated in FIG. 7f.

The preferably used SU-8 material is thereby robust to an anisotropic etching agent, for example, a KOH solution. In addition, the first dielectric insulating layer 2 also serves as a dielectric protection layer for the metallizations 5 and 6 from the KOH etching agent. In this way, the silicon substrate 1 can be back-etched below the windings of the spiral inductance in a simple manner using a conventional KOH wet etching procedure, without damaging the SU-8 membrane 3 or the metallizations 5 and 6.

Figure 7G:
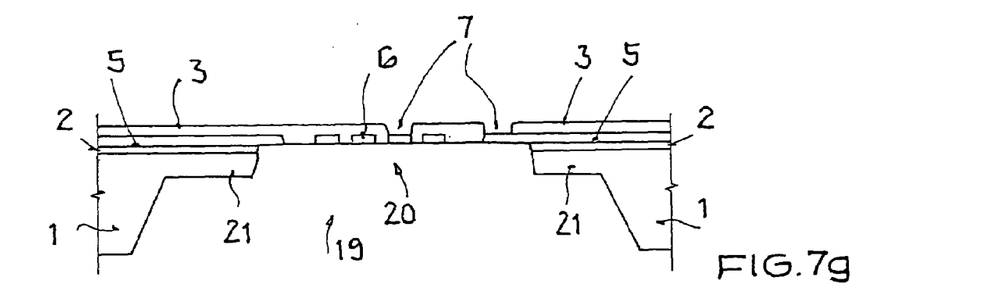

In a following step, the remaining segments of the fourth dielectric insulating layer 8 on the bottom side of the substrate 1 and the area of the first dielectric insulating layer 2, which covers the completely back-etched area 20, is removed using, for example, a dry etching procedure. This step and the resulting structure are schematically illustrated in FIG. 7g.

With this staggered structure, the geometric limitations can be reduced due to the diagonally back-etched areas, and adjacent spiral inductances can be arranged in closer proximity to one another without compromising the mechanical stability of the entire device. With the previously described method, shielding cavities can be formed below the spiral inductance without causing mechanical instability of the device so that beneficially, an increased integration density can be achieved.

It is once again noted at this point that in all figures, a uniform orientation of the device, that is, the substrate 1, is maintained such that the spiral inductance is located on the top side of the substrate 1. However, in practice it is beneficial to orient the substrate to the best advantage for the individual method steps so that the substrate can be rotated for the various method steps by employing a suitable substrate carrier device.

Figure 7H:
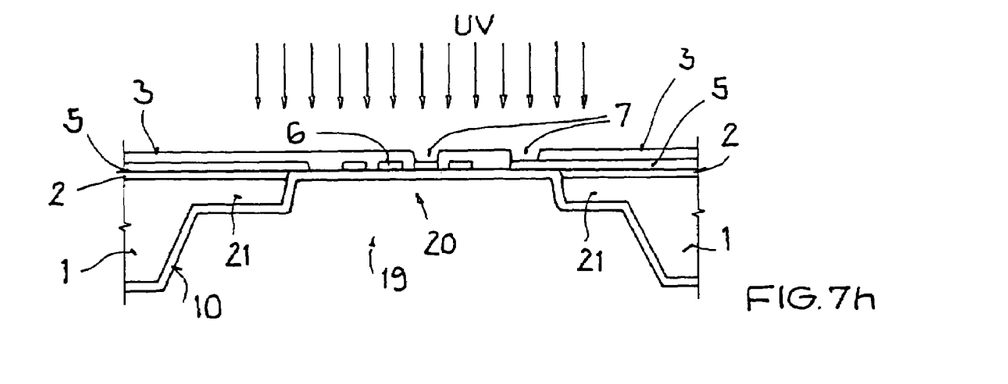

Next, as is illustrated in FIG. 7h, a photolack 10, for example, a negative photolack 10, is formed on the surface of the back-etched areas 19 and 20 and on the bottom side of the segment of the SU-8 layer 3, which covers the completely back-etched area 20, beginning at the bottom side of the substrate 1 and using, for example, a spin-coating technique. It will be obvious to one skilled in the art that instead of a negative photoresist, a positive photoresist, and corresponding method steps can also be used vice versa.

As is further illustrated in FIG. 7h, the photoresist layer 10, as is standard in a photolithographic procedure, is radiated, that is, is developed as a mask. For example, the top side of the device can be exposed to ultra-violet light. It goes without saying that with suitable materials, electrodes, x-rays, or ions can also be used as a radiation source. With such radiation, macromolecular bonds are disrupted or smaller molecules are polymerized in a negative photolacquer, whereby, with a subsequent treatment, they remain as structured residue and are not removed from the device.

Figure 7I:
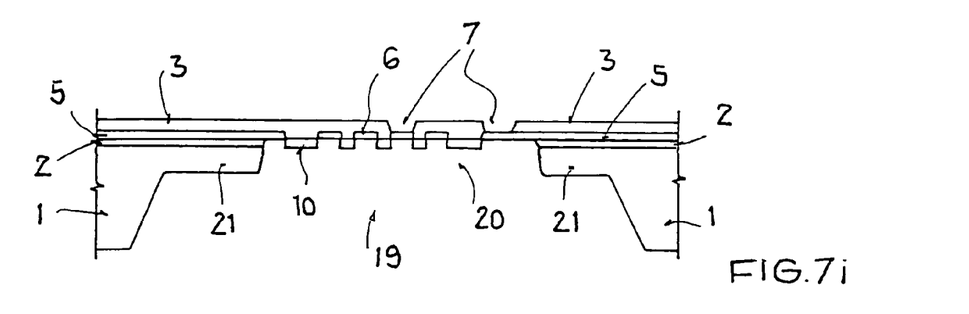

Subsequently, the negative photoresist 10 is developed such that the exposed areas remain attached to the bottom side of the membrane 3 below the intermediate areas between the individual metallization segments, whereas the non-exposed areas are removed. The non-exposed segments of the negative photoresist 10 are removed with a KOH solution, for example. In this way, the pattern as illustrated in FIG. 7i is attained.

Figure 7J:
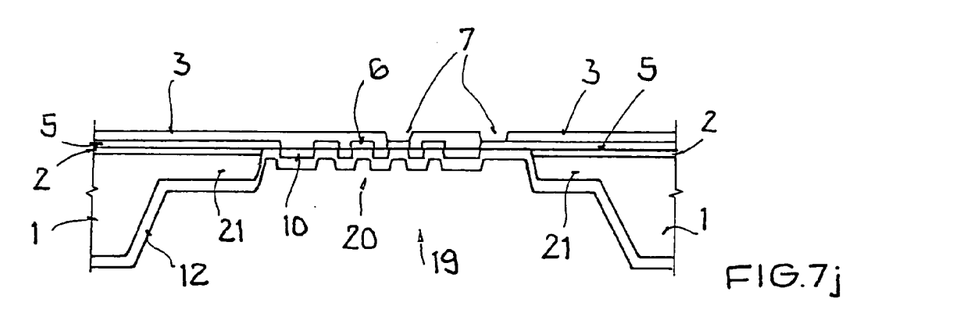

In a subsequent method step according to FIG. 7j, the bottom side of the substrate 1, that is, the back-etched areas 19 and 20, are subjected to a re-metallization, that is, the application of a lower metallization 12. Thus, the pattern as illustrated in FIG. 7j is achieved, whereby segments of the lower metallization are directly connectable to the respective upper ground conductors 5 in a beneficial way without a dielectric intermediate layer.

As is also shown in FIG. 7j, by adding the lower metallization 12 using a standard metallization procedure, the windings of the inductance metallization 6 can be thickened, thus reducing the electrical resistance of the windings in a beneficial manner.

Figure 7K:
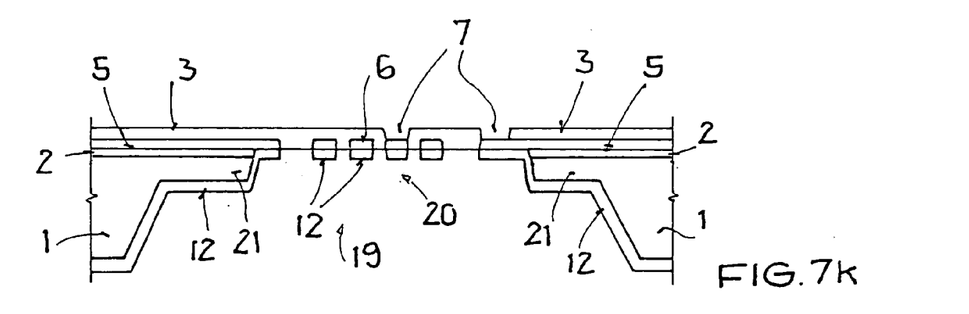

Next, the remaining segments of the negative photoresist 10 and the metal segments 12 deposited thereon are suitably removed by using a suitable procedure, for example, a rinsing procedure utilizing an acetone solution, as is shown in FIG. 7k. Thus, the pattern as illustrated in FIG. 7k is achieved.

Figure 7L:
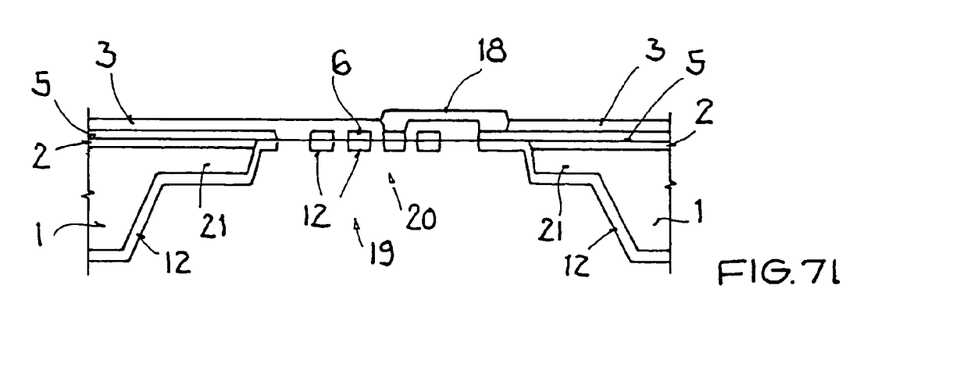

Thereafter, the interior connection of the spiral inductance is preferably electrically connected to a provided voltage connector via a bridgeover metallization 18, as is illustrated in FIG. 7l. The bridgeover openings 7, which preferably were previously formed in the SU-8 membrane 3 (see description with reference to FIG. 7b) are thereby structuredly connected with one another via a bridgeover metallization 18 so that an electrical connection of the inner winding end of the inductance metallization 6 with an outer connecting line is accomplished. Preferably, the bridgeover metallization 18 can be formed using a standard metallization procedure, thereby utilizing one of the previously listed beneficial materials.

Figure 7M:
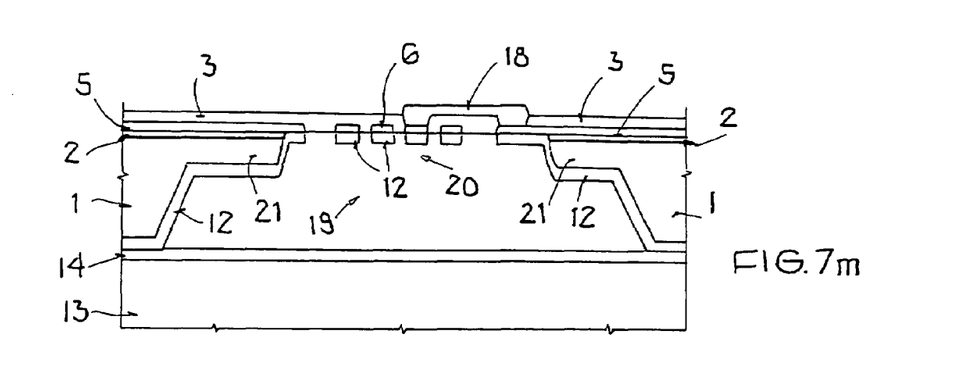

Lastly, an additional substrate 13 is preferably attached to the bottom side of the processed substrate 1 such that a completely closed hollow cavity, that is, a shielding area 19, 20 is formed. As is illustrated in FIG. 7m, the top side of the additional substrate 13, which is also a silicon substrate, for example, is provided with a metallization 14, thereby thickening the lower metallization 12, at least partially. With this added electrical conductor, the additional substrate 13 can be connected with the processed substrate 1, that is, the ground metallization 12 that is provided on the bottom side of this substrate 1. Alternatively, a connection can be brought about by annealing, that is, heat treatment, or by a microwave treatment.

As a result, the individual inductance metallizations do not need to be formed separately from one another and subsequently connected to one another with, for example, a flip-chip technique, but they can all be fabricated on one substrate in one collective and thus more cost-effective process.

Figure 8:
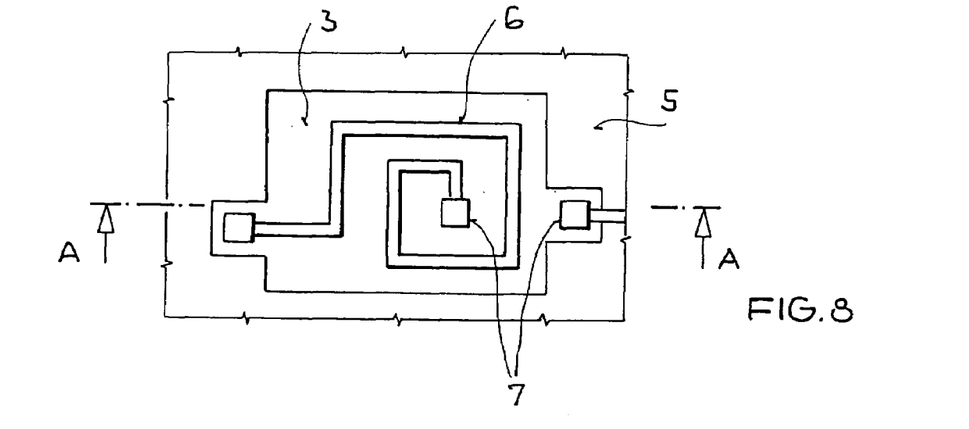
FIG. 8 is a schematic top view of the device in FIG. 7m according to the first embodiment of the present invention.

FIG. 8 illustrates a schematic view of a sectional plane of the spiral inductance of FIG. 7m, whereby FIG. 7m is a cross-sectional view along the line A—A in FIG. 8. As is shown in FIG. 8, the upper ground metallization 5 is preferably electrically separated from the inductance metallization 6 by the applied SU-8 membrane 3. According to the instant embodiment, the windings of the inductance metallization 6 are rectangular. It will be obvious to one skilled in the art that different winding shapes, for example, round windings, are also feasible.

Also in FIG. 8, the bridgeover openings 7 for a bridgeover metallization are schematically illustrated, whereby the inner winding end is connectable to an exterior connection due to the bridgeover metallization.

As has been previously described, it is preferable at the beginning of the fabrication process, during the construction of the second dielectric layer, that is, the membrane 3, to provide the membrane with suitable structures for further metallizations because doing so after the membrane 3 has hardened is difficult.

Figure 9:
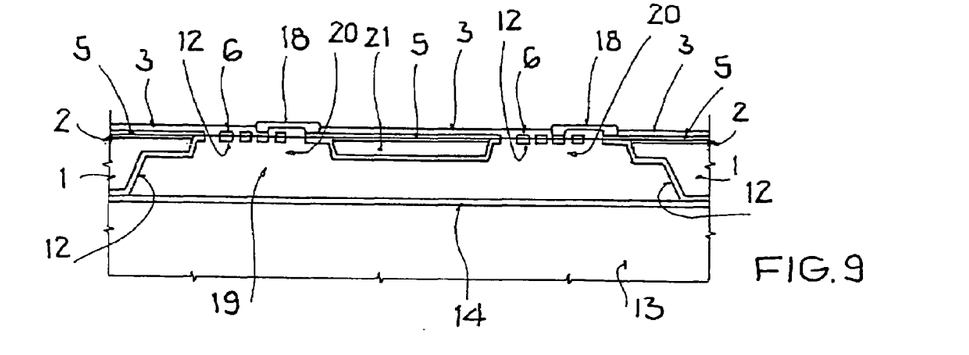
FIG. 9 is a cross-sectional view of a device with two inductances integrated on a substrate according to a second embodiment of the present invention.

FIG. 9 illustrates a cross-sectional view of a device according to a second embodiment of the present invention. The device includes, for example, two spiral inductances that are arranged adjacent to one another, which are fabricated simultaneously on a shared substrate 1 by collective method steps according to the first embodiment. As can be seen, the fabricated device has a mechanically stable structure due to the staggered construction and the thin substrate layer 21 between the two spiral inductances that are arranged adjacent to one another.

Figure 10:
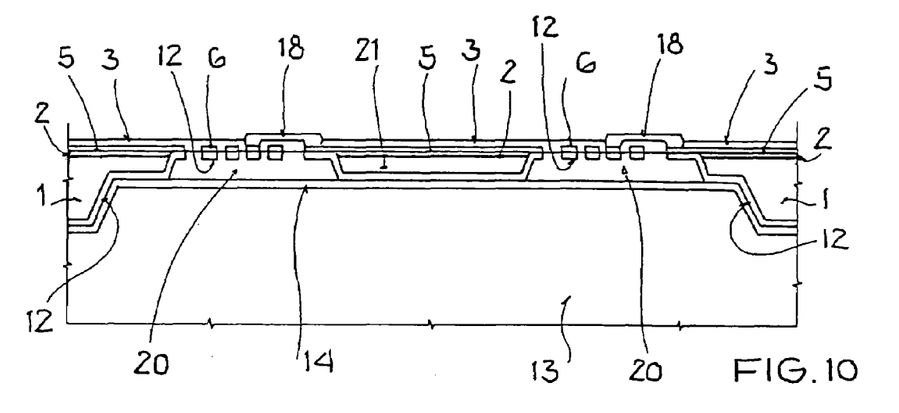
FIG. 10 is a cross-sectional view of a device having two inductances arranged on a substrate according to a third embodiment of the present invention.

In a preferred third embodiment of the present invention according to FIG. 10, the geometry of the second substrate 13, in contrast to the first and second embodiment, is such that it can be roughly formclosed inserted in the first back-etched area 19. In this way, an extremely compact form of construction is realized, wherein air gaps 20 for decoupling are still provided below the respective spiral inductance.

Preferably, the surface of the second substrate 13 is also provided with a metallization 14, which is firmly connected, at least in part, with the lower metallization 12 of the processed substrate 1. In this way, the added benefit of a uniform electrical connection of all ground metallizations 5, 12 is achieved so that only one common ground connection needs to be provided.

As is shown in FIG. 10, the two neighboring spiral inductances are also separated from one another by a thin substrate layer 21, whereby a mechanically stable construction is attained. Additionally, the thin substrate layer 21 between the two adjacent spiral inductances is further supported by the formclosed insertion of the additional substrate 13 in the first back-etched area 19, so that the overall mechanical stability of the device is substantially improved.

Figure 11:
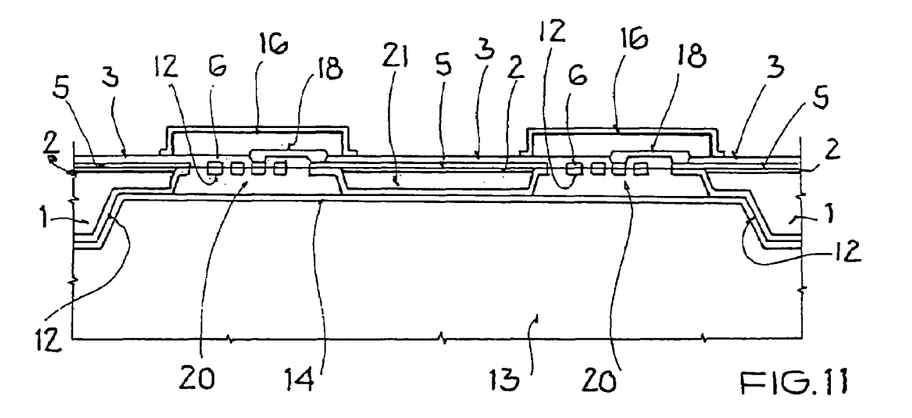
FIG. 11 is a cross-sectional view of a device with two inductances integrated on a substrate according to a fourth embodiment of the present invention.

FIG. 11 illustrates a cross-sectional view of a device according to a fourth embodiment of the present invention. As is shown in FIG. 11, a covering metallization 16 is additionally formed over the spiral inductance, whereby the rim areas of the covering metallization 16 are respectively connected with the upper ground metallization. The covering metallization 16 can be deposited by using a thick additional photoresist layer on the top side of the instant device. After a structuring of the SU-8 membrane 3 (again, preferably done during the application of the SU-8 layer), a thick photoresist layer, for example, about 30 µm thick, is deposited on the second dielectric insulating layer 3, and structured. Preferably, the sharp corners of the additional photoresist material can be smoothened, for example, by using an oxygen-plasma etching procedure. Thereafter, the shape of the covering metallization can be formed as a shield from external soiling and interferences by applying a standard metallization procedure.

In this manner, a closed system for additional protection of the spiral inductance from external interferences and dirt is constructed. Furthermore, the covering metallization 16 is thus arrayed for a common electrical connection of all ground metallizations so that only one universal ground connection needs to be provided.

It is noted at this point that the characteristic features of the devices of the individual embodiments can used in any combination so that a specific device for a particular application is constructed.

Although the present invention has been described with reference to preferred embodiments, it is not limitive thereon but can be modified in many ways.

For example, different materials can be used for the individual metallizations, for the substrate and for the individual dielectric insulating layers. Furthermore, different conventional techniques for structuring, back-etching of the substrate, removal of residual layers etc. can be employed. It goes without saying that any number of spiral inductances can be provided adjacent to one another depending on the available substrate area.

Thus, the present invention provides a device having a spiral inductance, and a production method for such a device, which, compared to conventional production methods, can be done with less expenditure. According to the present invention, no masks for photolithographic processes are needed for the fabrication of the membranes. Additionally, standard methods and collective method steps can be applied to a plurality of spiral inductances that are arranged adjacently to one another, whereby, compared to conventional devices, a more stable device with an increased integration density is constructed. Thus, the present production method is simpler, faster, and more cost-effective.

In addition, with the instant production method, a device can be fabricated in a simple way, whereby all ground metallizations are directly connected with one another such that only one single earth port is needed. Furthermore, the uniform connection of all ground metallizations guarantees a uniform ground connection, whereby no potential differences of the individual ground metallizations occur. In this way, additional losses due to possible current flows caused by the potential differences of various ground metallizations can be prevented. Additionally, the windings of the spiral inductance are made thicker in a simple way so that the electrical resistance of the windings is reduced.

The production method of the present invention is suitable for the production of a plurality of spiral inductances on a shared substrate and in integrated circuits, particularly in the high frequency field, because the substrate has a stable structure despite the provision of decoupling air gaps below the spiral inductance. This structure has the advantage that the windings of the spiral inductance are totally freely suspended above the hollow cavity, that is, the back-etched area 20 by embedment in the SU-8 membrane 3 so that a complete decoupling from the substrate is ensured. The ground metallizations can also be supported, at least partially, over the back-etched areas by embedment in the membrane and can, for the most part, thus be decoupled from neighboring devices.

Thus, an inductance integrated on a substrate can be fabricated cost-effectively and reliably in a simple way, which, compared with a conventional inductance, has a higher quality factor and an increased self-resonance. In addition, as has been discussed beforehand, dissipation is substantially reduced, that is, completely eliminated due to the fact that a decoupling from the actual substrate is done via the back-etched area of the substrate. Yet, the mechanical stability of the device is ensured due to the method of the present invention, although a big air gap is present below the spiral inductance in the substrate. Due to this back-etched open area, eddy currents in the earth planes are prevented so that no potential fluctuations occur.

Furthermore, a flexible connection of the membrane and the silicon substrate is created by utilizing the organic dielectric insulating layer 3 and by applying two consecutive substrate etching steps. This results in an increased mechanical stability in contrast to other conventional production methods, whereby membranes have been used that are comprised of a tri-layer construction of $SiO_2$—$Si_3N_4$—$SiO_2$.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for fabricating a spiral inductance on a substrate, the method comprising the steps of:
   forming a structured inductance metallization and a structured upper ground metallization on an upper surface of the substrate;
   forming a first insulating layer at least between the inductance metallization and the upper ground metallization and over the inductance metallization;
   back-etching of an area of the substrate below the inductance metallization such that at least a portion of the windings of the inductance metallization are embedded in the insulating layer for support and are suspended over the completely back-etched area of the substrate; and
   structured metallization of the surface of the back-etched area of the substrate for forming an end-to-end-connected ground point, and of the segments of the inductance metallization located above the back-etched area for forming thickened windings of the spiral inductance.

2. The method according to claim 1, wherein a second insulating layer, is formed on the upper surface of the substrate prior to the application of the metallizations.

3. The method according to claim 1, wherein the back-etching of the area of the substrate below the inductance metallization is performed in two consecutive substrate etching steps, wherein, in a first etching step, an area of the substrate below the inductance metallization is partially back-etched for forming a thin substrate layer, and wherein, in a subsequent second etching step, a segment of the thin substrate layer below the inductance metallization is back-etched for forming a staggered structure of the back-etched area of the substrate.

4. The method according to claim 3, wherein the first etching step is a wet chemical etching process.

5. The method according to claim 3, wherein the second etching step includes a deposition of a further insulating layer on a lower surface of the substrate and on a surface of the partially back-etched segment, and a structuring of the further insulating layer is performed by developing a vapor-deposited photoresist for a structured anisotropic back-etching of a segment of the thin substrate layer.

6. The method according to claim 5, wherein the photoresist is subsequently removed.

7. The method according to claim 6, wherein the remaining further insulating layer is removed by using a dry etching procedure prior to the application of the photoresist for structured metallization.

8. The method according to claim 2, wherein the additional step of removing the second insulating layer in the segment of the back-etched area of the substrate is performed by using a dry etching procedure prior to the application of the photoresist for the structured metallization.

9. The method according to claim 1, wherein, due to the structured metallization, a lower ground metallization is formed, which is respectively connected with one of the segments of the upper ground metallization, the segments being located above the back-etched area of the substrate.

10. The method according to claim 1, wherein an additional substrate is attached to a lower surface of the substrate for forming a hollow cavity between the additional substrate and the lower surface of the substrate.

11. The method according to claim 10, wherein the additional substrate is formed with a metallization on a surface thereof, which is at least partially connected with the lower ground metallization.

12. The method according to claim 10, wherein the additional substrate is formed such that it can be, at least in part, formclosed inserted in the partially back-etched area.

13. The method according to claim 1, wherein prior to the structured metallization, a photoresist layer is formed on the surface of the back-etched area of the substrate and radiated.

14. The method according to claim 1, wherein the first insulating layer is provided with bridgeover openings for bridging at least one connection of the spiral inductance.

15. The method according to claim 14, wherein a bridgeover metallization is formed between the bridgeover openings.

16. The method according to claim 1, wherein a covering metallization is formed over the inductance metallization by a photoresist layer, which is applied in the shape of a lid to the upper ground metallization.

17. The method according to claim 1, wherein a plurality of spiral inductances are provided, adjacent to one another, on the substrate, and wherein the substrate is subjected to collective substrate etching steps for forming respective back-etched areas below each of the spiral inductances.

18. The method according to claim 1, wherein the substrate is a silicon semiconductor substrate.

19. The method according to claim 2, wherein the second insulating layer is made of a dielectric inorganic insulation material, a silicon oxide, a silicon dioxide, silicon with air gaps, or silicon nitride.

20. The method according to claim 1, wherein the insulating layer is a dielectric membrane that is made of an organic insulation material, an organic polymer material, benzocyclobutene (BCB), SU-8, SiLK, or a polyimide.

21. The method according to claim 1, wherein the metallizations are made of aluminum, copper, silver, gold, or titanium.

22. A device comprising:
a substrate having a back-etched area on a lower surface thereof;
a first insulating layer, which is provided above the substrate and which completely covers the back-etched area;
an upper structured ground metallization;
at least one structured inductance metallization having windings, which are suspended over the back-etched area of the substrate by being embedded in the first insulating layer, for decoupling the structure inductance metallization from the substrate; and
a lower metallization formed on a surface of the back-etched area of the substrate, the lower metallization being applied from a bottom side of the substrate, for forming an end-to-end ground connection, and, on the segments of the spiral inductance that are located above the back-etched areas, for forming thickened windings of the spiral inductance.

23. The device according to claim 22, wherein an additional substrate is attached to the lower surface of the substrate for forming a hollow cavity between the additional substrate and the lower surface of the substrate.

24. The device according to claim 23, wherein the additional substrate has a metallization on a surface thereof, which is at least partially connectable to the lower metallization.

25. The device according to claim 23, wherein the additional substrate is formed so that it can be at least partially formclosed inserted in the back-etched areas.

26. The device according to claim 22, wherein bridgeover openings are provided in the first insulating layer for bridging at least one connection of the spiral inductance.

27. The device according to claim 26, wherein the bridgeover metallization is provided in between bridgeover openings.

28. The device according to claim 22, wherein a covering metallization is formed over the spiral inductance by a photoresist layer, which is attached to the upper ground metallization in the shape of a lid.

29. The device according to claim 22, wherein a plurality of spiral inductances are provided adjacent to one another on the substrate, and wherein the substrate is subjected to collective substrate etching steps for forming each of the back-etched areas below the respective spiral inductance.

30. The device according to claim 22, wherein the substrate is a silicon semiconductor substrate.

31. The device according to claim 22, wherein the insulating layer is made of a dielectric inorganic insulation material, a silicon oxide, a silicon dioxide, a silicon nitride, or silicon with buried air gaps.

32. The device according to claim 22, wherein the insulating layer is a membrane that is made of a dielectric organic insulation material, an organic polymer material, benzocyclobutene (BCB), SU-8, SiLK, or a polyimide.

33. The device according to claim 22, wherein the metallizations are made of aluminum, copper silver, gold, or titanium.

34. The method according to claim 2, wherein the second insulating layer is a dielectric insulating layer.

* * * * *